(12) United States Patent
Cowley et al.

(10) Patent No.: US 9,325,339 B2
(45) Date of Patent: Apr. 26, 2016

(54) SYSTEM FOR ANALOG TO DIGITAL CONVERSION WITH IMPROVED SPURIOUS FREE DYNAMIC RANGE

(75) Inventors: Nicholas P. Cowley, Wroughton (GB); Isaac Ali, Mississauga (CA); William L. Barber, Bampton (GB)

(73) Assignee: Intel Corporation, Santa Clara, CA (US)

( * ) Notice: Subject to any disclaimer, the term of this patent is extended or adjusted under 35 U.S.C. 154(b) by 6 days.

(21) Appl. No.: 13/995,211

(22) PCT Filed: May 1, 2012

(86) PCT No.: PCT/US2012/036009
§ 371 (c)(1),
(2), (4) Date: Aug. 15, 2014

(87) PCT Pub. No.: WO2013/165400
PCT Pub. Date: Nov. 7, 2013

(65) Prior Publication Data
US 2014/0349714 A1    Nov. 27, 2014

(51) Int. Cl.
*H03M 1/12* (2006.01)
*H03M 1/06* (2006.01)
(Continued)

(52) U.S. Cl.
CPC .............. *H03M 1/124* (2013.01); *H03B 28/00* (2013.01); *H03H 7/01* (2013.01); *H03M 1/0626* (2013.01); *H03M 1/1215* (2013.01)

(58) Field of Classification Search
CPC . H03M 1/124; H03M 1/0626; H03M 1/1215; H03B 28/00; H03H 7/01
USPC .................................................. 341/141, 155
See application file for complete search history.

(56) References Cited

U.S. PATENT DOCUMENTS 6,081,215 A     6/2000  Kost et al.
6,525,682 B2    2/2003  Yap et al.
(Continued)

FOREIGN PATENT DOCUMENTS

WO      2013/165400 A1     11/2013

OTHER PUBLICATIONS

International Search Report and Written Opinion received for PCT application No. PCT/US2012/036009, mailed on Feb. 6, 2013, 8 Pages.
(Continued)

*Primary Examiner* — Brian Young
(74) *Attorney, Agent, or Firm* — Grossman, Tucker, Perreault & Pfleger, PLLC (57) ABSTRACT

Generally, this disclosure describes an apparatus, systems and methods for analog to digital conversion with improved spurious free dynamic range. The system includes a segmented ADC circuit with a plurality of interleaved ADC segments, the segmented ADC circuit configured to generate a digital signal including a channel with an associated channel frequency; a frequency down-converter circuit coupled to the segmented ADC circuit, the frequency down-converter circuit configured to frequency shift the digital signal by a frequency offset; a spur frequency prediction circuit coupled to the frequency down-converter circuit, the spur frequency prediction circuit configured to predict frequencies of spurs generated by the ADC segments, the prediction based on the number of ADC segments and based on the sampling rate of the digital signal; the spur frequency prediction circuit further configured to generate the frequency offset based on the predicted spur frequencies and based on a frequency band of the channel; and a filter circuit coupled to the frequency down-converter circuit, the filter circuit configured to remove one or more of the spurs from the frequency shifted digital signal to generate a filtered signal.

32 Claims, 6 Drawing Sheets

(51) Int. Cl.
*H03B 28/00* (2006.01)
*H03H 7/01* (2006.01)

(56) References Cited

U.S. PATENT DOCUMENTS

| | | | |
|---|---|---|---|
| 7,183,953 B2 | 2/2007 | Kadota | |
| 7,839,313 B2* | 11/2010 | Kidambi | H03M 1/0624 341/118 |
| 8,872,680 B2* | 10/2014 | Ali | H03M 1/10 341/118 |
| 8,917,125 B1* | 12/2014 | Waltari | H03L 7/18 327/147 |
| 9,088,293 B1* | 7/2015 | D'Souza | H03M 1/121 |
| 9,143,149 B1* | 9/2015 | van Engelen | H03M 1/121 |

OTHER PUBLICATIONS

International Preliminary Report on Patentability and Written Opinion received for PCT Patent Application No. PCT/US2012/036009, mailed on Nov. 13, 2014, 5 pages.

* cited by examiner

SYSTEM FOR ANALOG TO DIGITAL CONVERSION WITH IMPROVED SPURIOUS FREE DYNAMIC RANGE

FIELD

The present disclosure relates to analog to digital conversion (ADC) systems, and more particularly, to ADC systems with improved spurious free dynamic range.

BACKGROUND

ADC systems sometimes comprise a number of interleaved ADC segments to achieve increased sampling rates. Each ADC segment may sample the input analog signal at a given sampling rate and at staggered time offsets from one segment to the next. The digital outputs from each ADC segment may be combined, in a time-interleaved manner, resulting in an output sampling rate for the system that is N times the sampling rate of the individual ADC segments, where N is the number of ADC segments.

Each of the ADC segments, however, often have DC imbalances, or output level offsets that differ from segment to segment. These sources of error may generate frequency spurs, which are signal artifacts that typically occur at the segment sampling rate and harmonic multiples of that rate. The DC imbalance is generally corrected by post-digitization processing which attempts to detect and calculate the imbalance and adjust the ADC output samples accordingly to reduce the spurs. This approach adds complexity and cost to the ADC system and typically introduces processing delay. Additionally, since a calibration process may be used, this approach suffers from reduced effectiveness in the case of time varying DC imbalances.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts, and in which:

Although the following Detailed Description will proceed with reference being made to illustrative embodiments, many alternatives, modifications, and variations thereof will be apparent to those skilled in the art.

DETAILED DESCRIPTION

Generally, this disclosure provides apparatus, systems and methods for analog to digital conversion with improved spurious free dynamic range. An ADC system that comprises a number of interleaved ADC segments to achieve increased sampling rates may generate frequency spurs resulting from any differences that may exist between the operation or performance of the segments. These spurs may be reduced or removed by predicting their frequency, down-converting the sampled signal based on the predicted frequency relative to the frequency band of a data channel of interest, and applying one or more filters to the down-converted signal. The prediction may be based on the number of interleaved ADC segments and the sampling frequency of the ADC system. In further embodiments, the ADC system may be part of a mobile communication device platform.

Some embodiments may be used in conjunction with one or more types of wireless communication signals and/or systems, for example, Radio Frequency (RF), Infra Red (IR), Frequency-Division Multiplexing (FDM), Orthogonal FDM (OFDM), Time-Division Multiplexing (TDM), Time-Division Multiple Access (TDMA), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth®, Global Positioning System (GPS), Wi-Fi, Wi-Max, Wireless Metropolitan Area Networks (WMAN), Wireless Wide Area Networks (WWAN), ZigBee™, Ultra-Wideband (UWB), Global System for Mobile communication (GSM), 2G, 2.5G, 3G, 3.5G, Enhanced Data rates for GSM Evolution (EDGE), or the like. Other embodiments may be used in various other devices, systems and/or networks.

Some embodiments may be used in conjunction with suitable limited-range or short-range wireless communication networks, for example, "piconets", e.g., a wireless area network, a WVAN, a WPAN, and the like.

Some embodiments may be used in conjunction with various devices and systems, for example, a video device, an audio device, an audio-video (A/V) device, a Set-Top-Box (STB), a Blu-ray disc (BD) player, a BD recorder, a Digital Video Disc (DVD) player, a High Definition (HD) DVD player, a DVD recorder, a HD DVD recorder, a Personal Video Recorder (PVR), a broadcast HD receiver, a video source, an audio source, a video sink, an audio sink, a stereo tuner, a broadcast radio receiver, a display, a flat panel display, a Personal Media Player (PMP), a digital video camera (DVC), a digital audio player, a speaker, an audio receiver, an audio amplifier, a data source, a data sink, a Digital Still camera (DSC), a Personal Computer (PC), a desktop computer, a mobile computer, a laptop computer, a notebook computer, a tablet computer, a smartphone, a digital television, a server computer, a handheld computer, a handheld device, a Personal Digital Assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless access point (AP), a wired or wireless router, a wired or wireless modem, a wired or wireless network, a wireless area network, a Wireless Video Are Network (WVAN), a Local Area Network (LAN), a WLAN, a PAN, a WPAN, devices and/or networks operating in accordance with existing Wireless HD™ and/or Wireless-Gigabit-Alliance (WGA) specifications and/or future versions and/or derivatives thereof, devices and/or networks operating in accordance with existing IEEE 802.11 (IEEE 802.11-2007: Wireless LAN Medium Access Control (MAC) and Physical Layer (PHY) Specifications) standards and amendments ("the IEEE 802.11 standards"), IEEE 802.16 standards for Worldwide Interoperability for Microwave Access (WiMAX), Third Generation Partnership Project (3GPP) including Long Term Evolution (LTE) and Long Term Evolution Advanced (LTE-A) and/or future versions and/or derivatives thereof, units and/or devices which are part of the above networks, one way and/or two-way radio communication systems, cellular radio-telephone communication systems, Wireless-Display (WiDi) device, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device (e.g., BlackBerry, Palm Treo), a Wireless Application Protocol (WAP) device, or the like.

The term "wireless device" as used herein includes, for example, a device capable of wireless communication, a communication device capable of wireless communication, a communication station capable of wireless communication, a portable or non-portable device capable of wireless communication, or the like. In some embodiments, a wireless device may be or may include a peripheral device that is integrated with a computer, or a peripheral device that is attached to a computer. In some embodiments, the term "wireless device" may optionally include a wireless service.

It should be understood that the present invention may be used in a variety of applications. Although the present invention is not limited in this respect, the circuits and techniques disclosed herein may be used in many apparatuses such as stations of a radio system or nodes on a cable network. Stations intended to be included within the scope of the present invention include, by way of example only, WLAN stations, wireless personal network (WPAN), and the like.

Figure 1:
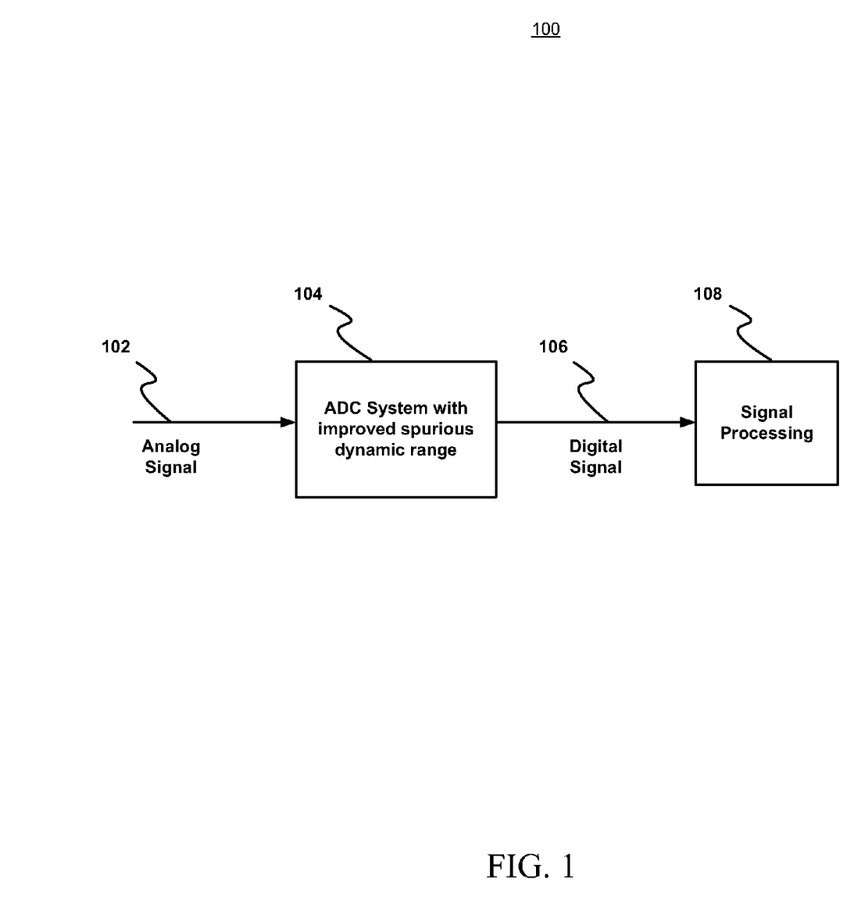
FIG. 1 illustrates a top level system diagram of one exemplary embodiment consistent with the present disclosure.

FIG. 1 illustrates a top level system diagram 100 of one exemplary embodiment consistent with the present disclosure. An analog input signal 102 may be provided to an ADC system with improved spurious dynamic range 104, which generates a digital output signal 106. The digital output signal 106 may then be provided to one or more signal processing modules 108 for further processing associated with a particular application. The ADC system 104 may comprise a number of ADC segments, operating at a given sampling rate, srate, the outputs of which may be time-interleaved to achieve a higher sampling rate, N*srate, where N is the number of ADC segments. The ADC system 104 may further comprise processing modules or circuits to reduce spur frequencies generated by DC imbalances between the ADC segments, as will be described in greater detail below.

In some embodiments the analog input signal 102 may be a radio frequency (RF) signal or an intermediate frequency (IF) signal. The analog input signal 102 may include one or more channels containing information or data of interest. These channels may be located at different frequency bands within the signal and may be modulated by any suitable modulation scheme, such as, for example, quadrature amplitude modulation (QAM). The location of these channel frequency bands within the signal may be known or capable of being determined by the system.

Figure 2:
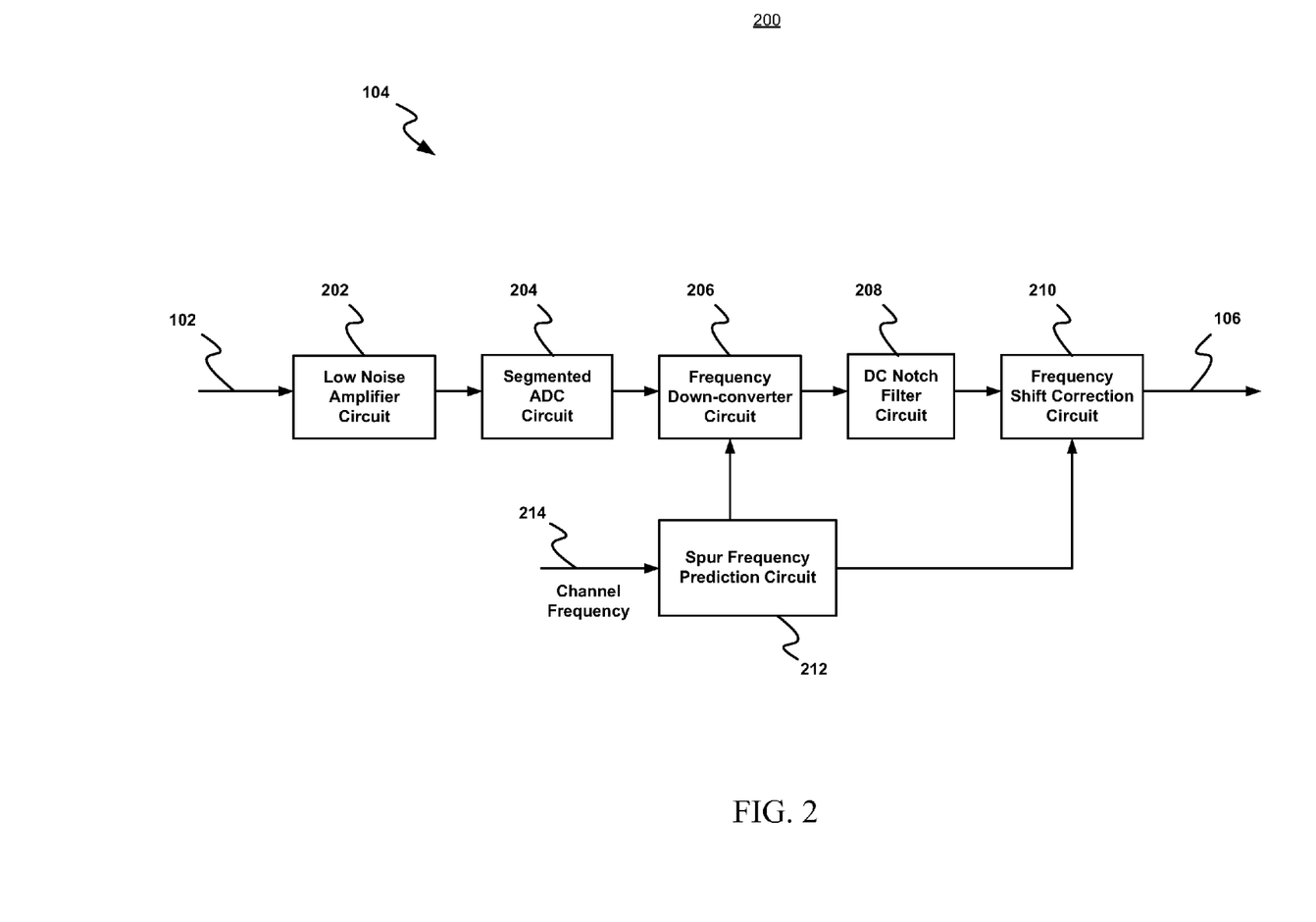
FIG. 2 illustrates a block diagram of one exemplary embodiment consistent with the present disclosure.

FIG. 2 illustrates a block diagram 200 of one exemplary embodiment consistent with the present disclosure. ADC system with improved spurious dynamic range 104 is shown to include a low noise amplifier (LNA) circuit 202, a segmented ADC circuit 204, a frequency down-converter circuit 206, a DC notch filter circuit 208, a frequency shift correction circuit 210 and a spur frequency prediction circuit 212, the operations of which will be described below.

Figure 3:
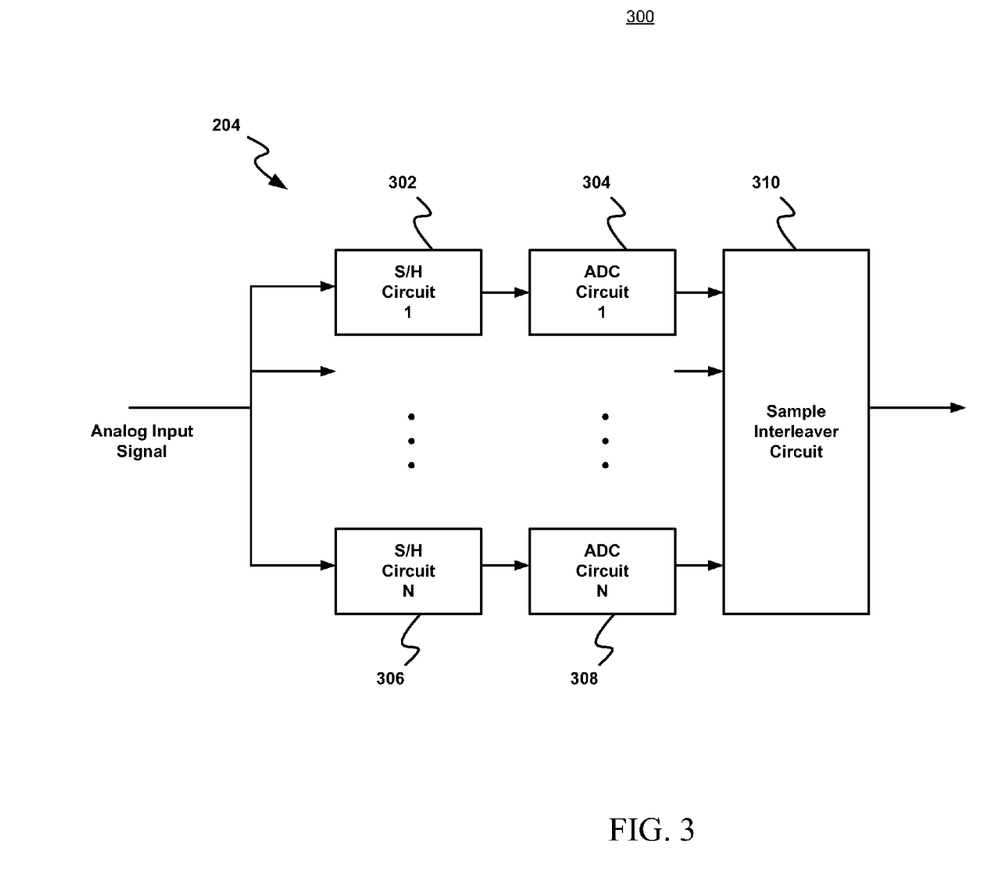
FIG. 3 illustrates a block diagram of another exemplary embodiment consistent with the present disclosure.

Analog input signal 102, which may optionally be amplified by LNA circuit 202, is provided to segmented ADC circuit 204. The details of segmented ADC circuit 204 are shown in FIG. 3, where the analog input signal is provided to a plurality of sample and hold (S/H) circuits 302, 306 which may each sample the analog signal at a sampling rate, srate, but at staggered time offsets. To illustrate this, if srate were set to 1 Hertz (Hz), to provide a simple numerical example, and if there were only two S/H circuits, the sampling period for each of the S/H circuits would be 1 second but they would be offset in time by a half second. In other words, the first S/H circuit would sample at times t=0, 1, 2, . . . , while the second S/H circuit would sample at times t=0.5, 1.5, 2.5, . . . . The outputs of each S/H circuit 302, 306 are coupled to ADC circuits 304, 308, which convert them to digital samples. The digital samples are then assembled into an ADC output signal by sample interleaver circuit 310. Continuing with the example above, the output times from the sample interleaver circuit 310 would occur at t=0, 0.5, 1, 1.5, 2, 2.5, . . . which effectively doubles the sampling rate that could be achieved with a single such ADC segment. In practice, of course, more than two ADC segments may be employed to increase the sampling rate by a factor of N, where N is the number of ADC segments, and higher sampling rates may typically be used.

In some embodiments, a single sample and hold circuit (not shown), sampling at N*srate, may provide an output in parallel to each of the N sample and hold circuits 302, 306. This technique may be employed to reduce timing errors that may exist between the clock signals that switch the N sample and hold circuits 302, 306.

Returning now to FIG. 2, the output of the segmented ADC circuit 204 is down shifted in frequency, by frequency down-converter circuit 206. The frequency shift may be from a higher frequency, such as RF, down to a lower frequency, such as IF or baseband. The frequency down-converter circuit 206 may perform a complex frequency shift by mixing the signal with both an in-phase (I) and quadrature (Q) version of a digital local oscillator (LO) signal to preserve phase information in the down-converted signal. In some embodiments, the LO signal may be directly generated as a digital signal or it may be converted from an analog to a digital signal. The frequency of the LO signal (and/or the LO signal itself) may be provided by spur frequency prediction circuit 212, which predicts the frequency of spurs that may be generated by DC imbalances between the ADC segments. Because the outputs of the ADC segments are interleaved in time, any difference in DC offset between the segments can create a signal artifact in the output signal, which may be in the form of a step function from one DC level to the next with transitions at the sampling period of the ADC segments. This may then result in frequency spurs at the segment sampling rate and harmonic multiples of that rate.

Based on knowledge of the sampling rate and the number of ADC segments, the frequency prediction circuit 212 can calculate the location of the frequency spurs. For example, the frequency spurs may be located at harmonic multiples of the output sampling rate divided by the number of ADC segments. Additionally, based on knowledge of the frequency and bandwidth of the channel of interest, the frequency prediction circuit 212 can determine if a particular frequency spur lies within the channel to be tuned by the LO frequency.

This may result in the frequency down-converter circuit 206 being adjusted to shift the spur that lies within the channel of interest down to DC.

The output of frequency down-converter circuit 206 is provided to DC notch filter circuit 208 which may then filter out the spur within the channel of interest, the spur now being located at DC. The notch filter may be configured to be sufficiently narrow so as to leave the channel substantially unaffected. For example, in the case of a 256-QAM modulated channel, a notch filter having a width of less than 100 Hz may have an acceptably low impact on signal quality. An additional low pass filter, not shown, may be applied to remove the other spur frequency harmonics that are more distantly located from the channel.

Frequency shift correction circuit 210 may optionally be employed to further frequency shift the signal such that the channel of interest is centered at DC for applications where baseband processing of the channel is desirable. The frequency shifting may be accomplished by mixing with a second LO signal having a frequency based on the difference between the frequencies of the channel and the spur that was removed by filtering described above. The frequency for this second LO (and/or the second LO signal itself) may also be provided by spur frequency prediction circuit 212.

If no spur is determined to lie within the channel of interest then the frequency down-converter circuit 206 may down shift the channel so that it is substantially symmetric around DC in which case DC notch filter processing may be omitted and there may be no frequency shift correction that needs to be performed by frequency shift correction circuit 210.

Figure 4:
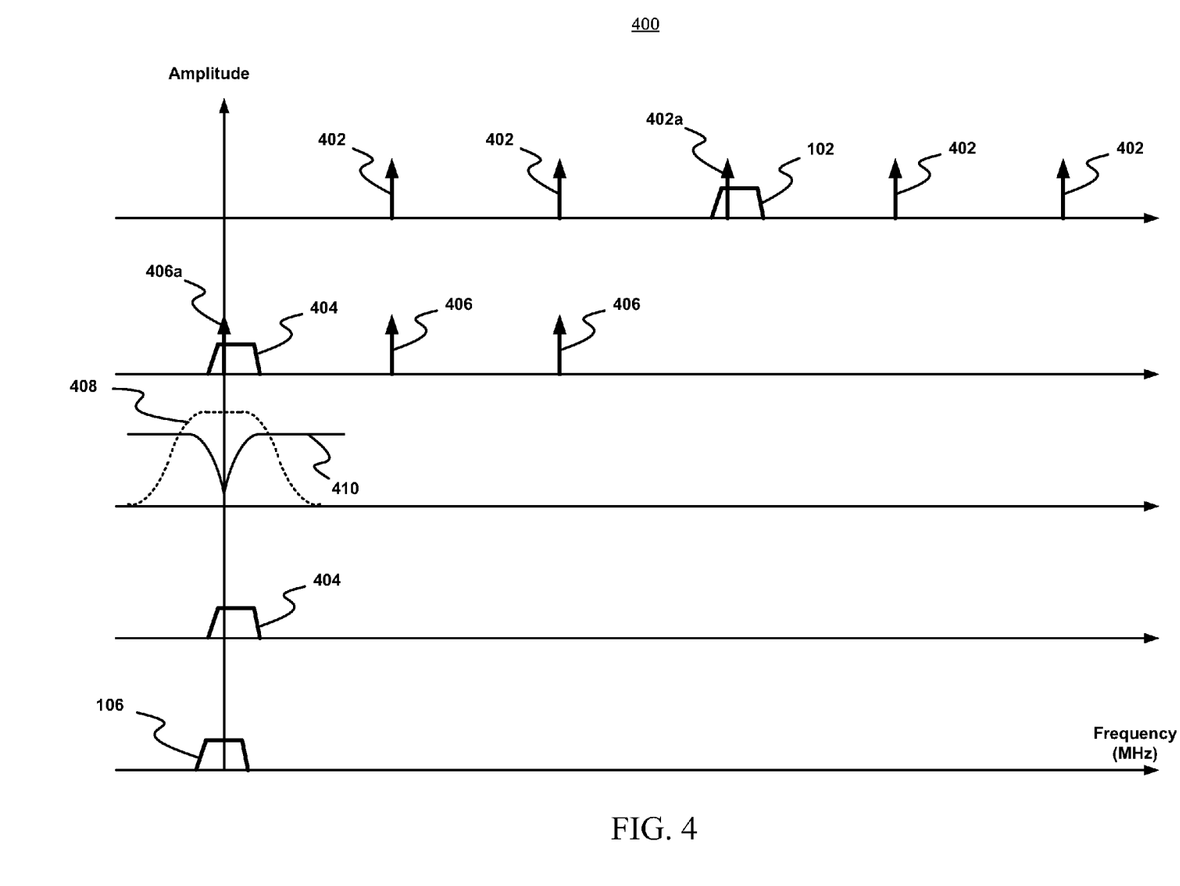
FIG. 4 illustrates signal plots associated with processing by an exemplary embodiment consistent with the present disclosure.

FIG. 4 illustrates signal plots 400 associated with processing by an exemplary embodiment consistent with the present disclosure. These plots provide illustrative examples of amplitude versus frequency for the signals at various stages of processing. The first (or top) plot shows the input signal 102 with a single channel of interest at a particular amplitude and frequency bandwidth. Also shown are frequency spur harmonics 402, one of which, 402a lies within the channel of interest 102. The second plot shows the result of frequency down-converting such that the spur within the signal channel is now shifted to DC 406a. The shifted channel 404 and the other shifted spurs 406 are also indicated. In the third plot a notch filter 410 is shown at DC configured to remove the spur located at DC. An optional low pass filter 408 is also shown configured to remove the remaining spur harmonics 406 while leaving the shifted channel 404 substantially unaffected as shown in the fourth plot. In the fifth plot, the channel 404 is further shifted down to DC resulting in the output signal 106.

Figure 5:
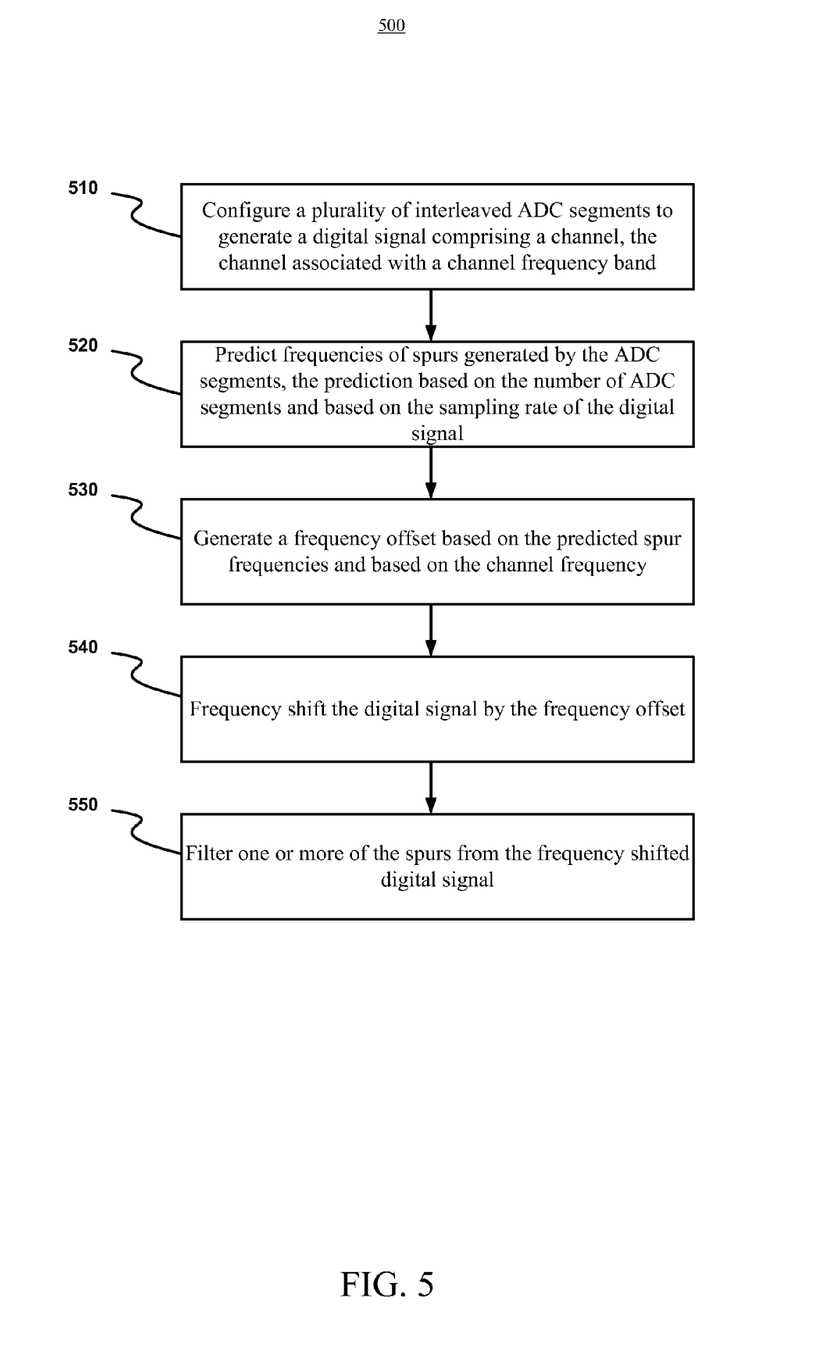
FIG. 5 illustrates a flowchart of operations of an exemplary embodiment consistent with the present disclosure.

FIG. 5 illustrates a flowchart of operations 500 of an exemplary embodiment consistent with the present disclosure. At operation 510, a plurality of interleaved ADC segments are configured to generate a digital signal comprising a channel. The channel is associated with a channel frequency band. At operation 520, a prediction is made of frequencies of spurs generated by the ADC segments. The prediction is based on the number of ADC segments and on the sampling rate of the digital signal. At operation 530, a frequency offset is generated. The frequency offset is based on the predicted spur frequencies and on the channel frequency. In some embodiments, the frequency offset may not be generated if the predicted spur frequencies are not located within the bandwidth of the channel of interest in which case, one or more of the subsequent processing steps may not be performed. At operation 540, the digital signal is frequency shifted by the frequency offset. At operation 550, one or more of the spurs are filtered from the frequency shifted digital signal.

Figure 6:
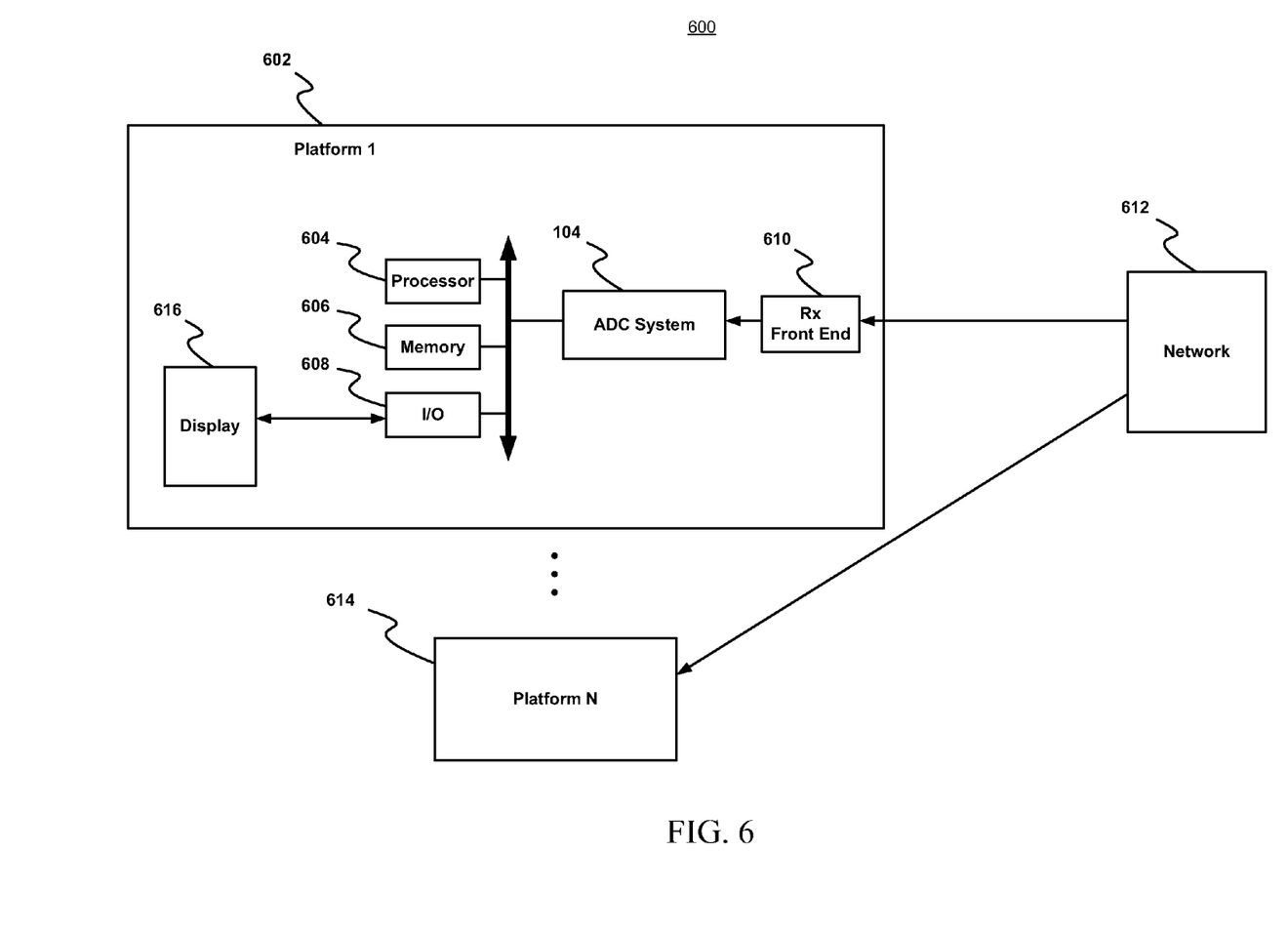
FIG. 6 illustrates a system diagram showing platforms consistent with an exemplary embodiment of the present disclosure in a network.

FIG. 6 illustrates a system diagram 600 showing platforms consistent with an exemplary embodiment of the present disclosure in a network. A platform 602, 614 may be a mobile communication device, such as, for example, a smartphone, a tablet, a digital television, a laptop computing device or any other device configured to transmit or receive modulated signals. Although only two platforms 602, 614 are shown, there may be any number of such platforms. In some embodiments, the platforms 602, 614 may comprise a processor 604, memory 606, an input/output (I/O) system 608, a display 616, or other type of user interface (UI) such as, for example, a touchscreen, coupled to the I/O system, an ADC system 104 and a receiver front end 610 configured to provide an analog signal to ADC system 104. The analog signal may be an RF signal. In some embodiments, platforms 602, 614 may also comprise a user interface (UI) such as, for example, a touchscreen. Any number of platforms 602, 614 may transmit or receive signals over a network 612. In some embodiments, network 612 may be a Wireless Metropolitan Area Network (WMAN), a Wireless Metropolitan Area Network (WMAN), a cable network, a digital television network or any other suitable wireless or wired network.

Embodiments of the methods described herein may be implemented in a system that includes one or more storage mediums having stored thereon, individually or in combination, instructions that when executed by one or more processors perform the methods. Here, the processor may include, for example, a system CPU (e.g., core processor) and/or programmable circuitry. Thus, it is intended that operations according to the methods described herein may be distributed across a plurality of physical devices, such as processing structures at several different physical locations. Also, it is intended that the method operations may be performed individually or in a subcombination, as would be understood by one skilled in the art. Thus, not all of the operations of each of the flow charts need to be performed, and the present disclosure expressly intends that all subcombinations of such operations are enabled as would be understood by one of ordinary skill in the art.

The storage medium may include any type of tangible medium, for example, any type of disk including floppy disks, optical disks, compact disk read-only memories (CD-ROMs), compact disk rewritables (CD-RWs), digital versatile disks (DVDs) and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions.

"Circuitry", as used in any embodiment herein, may comprise, for example, singly or in any combination, hardwired circuitry, programmable circuitry, state machine circuitry, and/or firmware that stores instructions executed by programmable circuitry. An app may be embodied as code or instructions which may be executed on programmable circuitry such as a host processor or other programmable circuitry. A module, as used in any embodiment herein, may be embodied as circuitry. The circuitry may be embodied as an integrated circuit, such as an integrated circuit chip.

Thus, the present disclosure provides an apparatus, method and system for analog to digital conversion using interleaved ADC segments with improved spurious free dynamic range. A reduction of the frequency spurs may be accomplished by prediction of the location of the spurs, down-converting a channel of interest such that a spur located within the channel is shifted to DC and then removing the spur with a DC notch filter. The ADC system may be part of a mobile communication platform.

According to one aspect there is provided an apparatus. The apparatus may include a segmented ADC circuit including a plurality of interleaved ADC segments, the segmented ADC circuit configured to generate a digital signal including a channel, the channel associated with a channel frequency. The apparatus of this example may also include a frequency down-converter circuit coupled to the segmented ADC circuit, the frequency down-converter circuit configured to frequency shift the digital signal by a frequency offset. The apparatus of this example may further include a spur frequency prediction circuit coupled to the frequency down-converter circuit, the spur frequency prediction circuit configured to predict frequencies of spurs generated by the ADC segments, the prediction based on the number of the ADC segments and based on the sampling rate of the digital signal; the spur frequency prediction circuit further configured to generate the frequency offset based on the predicted spur frequencies and based on a frequency band of the channel. The apparatus of this example may further include a filter circuit coupled to the frequency down-converter circuit, the filter circuit configured to remove one or more of the spurs from the frequency shifted digital signal to generate a filtered signal.

Another example apparatus includes the forgoing components and the predicted spur frequencies are harmonic multiples of the sampling rate of the digital signal divided by the number of ADC segments.

Another example apparatus includes the forgoing components and the frequency offset is generated by selecting the frequency of the predicted spur frequencies that lies within the channel frequency band.

Another example apparatus includes the forgoing components and the spur frequency prediction circuit is further configured to generate the frequency offset in response to determining that one of the predicted spur frequencies lies within the channel frequency band.

Another example apparatus includes the forgoing components and the filter circuit is configured as a DC notch filter.

Another example apparatus includes the forgoing components and further includes a frequency shift correction circuit coupled to the filter circuit, the frequency shift correction configured to frequency shift the filtered signal by a second frequency offset, the second frequency offset based on a difference between the selected spur frequency and the channel frequency band.

Another example apparatus includes the forgoing components and the frequency shift correction circuit further includes a low pass filter circuit configured to remove one or more remaining harmonics of the spurs.

According to another aspect there is provided a method. The method may include configuring a plurality of interleaved ADC segments to generate a digital signal including a channel, the channel associated with a channel frequency band. The method of this example may also include predicting frequencies of spurs generated by the ADC segments, the prediction based on the number of the ADC segments and based on the sampling rate of the digital signal. The method of this example may further include generating a frequency offset based on the predicted spur frequencies and based on the channel frequency. The method of this example may further include frequency shifting the digital signal by the frequency offset. The method of this example may further include filtering one or more of the spurs from the frequency shifted digital signal.

Another example method includes the forgoing operations and the predicted spur frequencies are harmonic multiples of the sampling rate of the digital signal divided by the number of ADC segments.

Another example method includes the forgoing operations and the frequency offset generation further includes selecting the frequency of the predicted spur frequencies that lies within the channel frequency band.

Another example method includes the forgoing operations and the frequency offset generation is performed in response to determining that one of the predicted spur frequencies lies within the channel frequency band.

Another example method includes the forgoing operations and the filtering further includes employing a DC notch filter.

Another example method includes the forgoing operations and further includes frequency shifting the filtered signal by a second frequency offset, the second frequency offset based on a difference between the selected spur frequency and the channel frequency band.

Another example method includes the forgoing operations and further includes low pass filtering to remove one or more remaining harmonics of the spurs.

According to another aspect there is provided at least one computer-readable storage medium having instructions stored thereon which when executed by a processor, cause the processor to perform the steps of the method as described in the examples above.

According to another aspect there is provided a mobile communication platform. The mobile communication platform may include a processor, a memory coupled to the processor, an I/O system coupled to the processor, a display coupled to the I/O system and an ADC system coupled to the processor. The ADC system of this example may include a segmented ADC circuit including a plurality of interleaved ADC segments, the segmented ADC circuit configured to generate a digital signal including a channel, the channel associated with a channel frequency. The ADC system of this example may also include a frequency down-converter circuit coupled to the segmented ADC circuit, the frequency down-converter circuit configured to frequency shift the digital signal by a frequency offset. The ADC system of this example may further include a spur frequency prediction circuit coupled to the frequency down-converter circuit, the spur frequency prediction circuit configured to predict frequencies of spurs generated by the ADC segments, the prediction based on the number of the ADC segments and based on the sampling rate of the digital signal; the spur frequency prediction circuit further configured to generate the frequency offset based on the predicted spur frequencies and based on a frequency band of the channel. The ADC system of this example may further include a filter circuit coupled to the frequency down-converter circuit, the filter circuit configured to remove one or more of the spurs from the frequency shifted digital signal to generate a filtered signal.

Another example system includes the forgoing components and the predicted spur frequencies are harmonic multiples of the sampling rate of the digital signal divided by the number of ADC segments.

Another example system includes the forgoing components and the frequency offset is generated by selecting the frequency of the predicted spur frequencies that lies within the channel frequency band.

Another example system includes the forgoing components and the spur frequency prediction circuit is further configured to generate the frequency offset in response to determining that one of the predicted spur frequencies lies within the channel frequency band.

Another example system includes the forgoing components and the filter circuit is configured as a DC notch filter.

Another example system includes the forgoing components and further includes a frequency shift correction circuit coupled to the filter circuit, the frequency shift correction configured to frequency shift the filtered signal by a second frequency offset, the second frequency offset based on a difference between the selected spur frequency and the channel frequency band.

Another example system includes the forgoing components and the frequency shift correction circuit further includes a low pass filter circuit configured to remove one or more remaining harmonics of the spurs.

Another example system includes the forgoing components and the platform is one of a smartphone, a tablet, a digital television or a laptop computing device.

Another example system includes the forgoing components and a plurality of the platforms are configured to communicate over a network.

Another example system includes the forgoing components and the network is a WWAN.

Another example system includes the forgoing components and the network is a WMAN.

Another example system includes the forgoing components and the network is a digital television network.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. An analog to digital conversion (ADC) system comprising:
   a segmented ADC circuit comprising a plurality of interleaved ADC segments, said segmented ADC circuit configured to generate a digital signal comprising a channel, said channel associated with a channel frequency;
   a frequency down-converter circuit coupled to said segmented ADC circuit, said frequency down-converter circuit configured to frequency shift said digital signal by a frequency offset;
   a spur frequency prediction circuit coupled to said frequency down-converter circuit, said spur frequency prediction circuit configured to predict frequencies of spurs generated by said ADC segments, said prediction based on the number of said ADC segments and based on the sampling rate of said digital signal; said spur frequency prediction circuit further configured to generate said frequency offset based on said predicted spur frequencies and based on a frequency band of said channel; and
   a filter circuit coupled to said frequency down-converter circuit, said filter circuit configured to remove one or more of said spurs from said frequency shifted digital signal to generate a filtered signal.

2. The ADC system of claim 1, wherein said predicted spur frequencies are harmonic multiples of said sampling rate of said digital signal divided by said number of ADC segments.

3. The ADC system of claim 1, wherein said frequency offset is generated by selecting the frequency of said predicted spur frequencies that lies within said channel frequency band.

4. The ADC system of claim 1, wherein said spur frequency prediction circuit is further configured to generate said frequency offset in response to determining that one of said predicted spur frequencies lies within said channel frequency band.

5. The ADC system of claim 1, wherein said filter circuit is configured as a DC notch filter.

6. The ADC system of claim 3, further comprising a frequency shift correction circuit coupled to said filter circuit, said frequency shift correction configured to frequency shift said filtered signal by a second frequency offset, said second frequency offset based on a difference between said selected spur frequency and said channel frequency band.

7. The ADC system of claim 6, wherein said frequency shift correction circuit further comprises a low pass filter circuit configured to remove one or more remaining harmonics of said spurs.

8. A method for analog to digital conversion, said method comprising:
   configuring a plurality of interleaved ADC segments to generate a digital signal comprising a channel, said channel associated with a channel frequency band;
   predicting frequencies of spurs generated by said ADC segments, said prediction based on the number of said ADC segments and based on the sampling rate of said digital signal;
   in response to determining that one of said predicted spur frequencies lies within said channel frequency band, generating a frequency offset based on said predicted spur frequencies and based on said channel frequency band;
   frequency shifting said digital signal by said frequency offset; and
   filtering one or more of said spurs from said frequency shifted digital signal.

9. The method of claim 8, wherein said predicted spur frequencies are harmonic multiples of said sampling rate of said digital signal divided by said number of ADC segments.

10. The method of claim 8, wherein said frequency offset generation further comprises selecting the frequency of said predicted spur frequencies that lies within said channel frequency band.

11. The method of claim 8, wherein said filtering further comprises employing a DC notch filter.

12. The method of claim 10, further comprising frequency shifting said filtered signal by a second frequency offset, said second frequency offset based on a difference between said selected spur frequency and said channel frequency band.

13. The method of claim 11, further comprising low pass filtering to remove one or more remaining harmonics of said spurs.

14. A non-transitory computer-readable storage medium having instructions stored thereon which when executed by a processor result in the following operations for estimating receiver noise variance, said operations comprising:
   configuring a plurality of interleaved ADC segments to generate a digital signal comprising a channel, said channel associated with a channel frequency band;
   predicting frequencies of spurs generated by said ADC segments, said prediction based on the number of said ADC segments and based on the sampling rate of said digital signal;

in response to determining that one of said predicted spur frequencies lies within said channel frequency band, generating a frequency offset based on said predicted spur frequencies and based on said channel frequency band;

frequency shifting said digital signal by said frequency offset; and filtering one or more of said spurs from said frequency shifted digital signal.

15. The computer-readable storage medium of claim 14, wherein said predicted spur frequencies are harmonic multiples of said sampling rate of said digital signal divided by said number of ADC segments.

16. The computer-readable storage medium of claim 15, wherein said frequency offset generation further comprises selecting the frequency of said predicted spur frequencies that lies within said channel frequency band.

17. The computer-readable storage medium of claim 15, wherein said filtering further comprises employing a DC notch filter.

18. The computer-readable storage medium of claim 14, wherein said operations further comprise frequency shifting said filtered signal by a second frequency offset, said second frequency offset based on a difference between said selected spur frequency and said channel frequency band.

19. The computer-readable storage medium of claim 18, wherein said operations further comprise low pass filtering to remove one or more remaining harmonics of said spurs.

20. A mobile communication platform comprising:
a processor;
a memory coupled to said processor;
an input/output (I/O) system coupled to said processor;
a display coupled to said I/O system; and
an ADC system coupled to said processor, said ADC system comprising:
a segmented ADC circuit comprising a plurality of interleaved ADC segments, said segmented ADC circuit configured to generate a digital signal comprising a channel, said channel associated with a channel frequency;
a frequency down-converter circuit coupled to said segmented ADC circuit, said frequency down-converter circuit configured to frequency shift said digital signal by a frequency offset;
a spur frequency prediction circuit coupled to said frequency down-converter circuit, said spur frequency prediction circuit configured to predict frequencies of spurs generated by said ADC segments, said prediction based on the number of said ADC segments and based on the sampling rate of said digital signal; said spur frequency prediction circuit further configured to generate said frequency offset based on said predicted spur frequencies and based on a frequency band of said channel; and
a filter circuit coupled to said frequency down-converter circuit, said filter circuit configured to remove one or more of said spurs from said frequency shifted digital signal to generate a filtered signal.

21. The mobile communication platform of claim 20, wherein said predicted spur frequencies are harmonic multiples of said sampling rate of said digital signal divided by said number of ADC segments.

22. The mobile communication platform of claim 20, wherein said frequency offset is generated by selecting the frequency of said predicted spur frequencies that lies within said channel frequency band.

23. The mobile communication platform of claim 20, wherein said spur frequency prediction circuit is further configured to generate said frequency offset in response to determining that one of said predicted spur frequencies lies within said channel frequency band.

24. The mobile communication platform of claim 20, wherein said filter circuit is configured as a DC notch filter.

25. The mobile communication platform of claim 22, further comprising a frequency shift correction circuit coupled to said filter circuit, said frequency shift correction configured to frequency shift said filtered signal by a second frequency offset, said second frequency offset based on a difference between said selected spur frequency and said channel frequency band.

26. The mobile communication platform of claim 25, wherein said frequency shift correction circuit further comprises a low pass filter circuit configured to remove one or more remaining harmonics of said spurs.

27. The mobile communication platform of claim 20, wherein said platform is one of a smartphone, a tablet, a digital television or a laptop computing device.

28. The mobile communication platform of claim 20, wherein said I/O system further comprises a touchscreen.

29. The mobile communication platform of claim 20, further comprising a plurality of said platforms each configured to communicate over a network.

30. The mobile communication platform of claim 29, wherein said network is a Wireless Wide Area Network (WWAN).

31. The mobile communication platform of claim 29, wherein said network is a Wireless Metropolitan Area Network (WMAN).

32. The mobile communication platform of claim 29, wherein said network is a digital television network.

* * * * *